United States Patent [19]

Brosch et al.

[11] 4,397,002

[45] Aug. 2, 1983

[54] CIRCUIT ARRANGEMENT FOR CAPACITIVE READ SIGNAL AMPLIFICATION IN AN INTEGRATED SEMICONDUCTOR STORE WITH STORAGE CELLS IN MTL TECHNOLOGY

[75] Inventors: Rudolf Brosch, Sindelfingen; Helmut H. Heimeier, Herrenberg; Wilfried Klein, Holzgerlingen; Friedrich Wernicke, Schoenaich, all of Fed. Rep. of Germany

[73] Assignee: International Business Machines Corporation, Armonk, N.Y.

[21] Appl. No.: 179,581

[22] Filed: Aug. 21, 1980

[30] Foreign Application Priority Data

Dec. 22, 1979 [DE] Fed. Rep. of Germany ....... 2951945

[51] Int. Cl.³ .............................................. G11C 7/00
[52] U.S. Cl. .................................... 365/190; 365/154
[58] Field of Search ....................... 365/189, 190, 154

[56] References Cited

U.S. PATENT DOCUMENTS

| | | | |
|---|---|---|---|
| 3,736,477 | 5/1973 | Berger et al. | 317/235 R |
| 3,816,758 | 6/1974 | Berger et al. | 307/214 |
| 4,007,451 | 2/1977 | Heuber et al. | 365/190 |
| 4,021,786 | 5/1977 | Peterson | 365/154 |
| 4,023,148 | 5/1977 | Heuber et al. | 365/190 |
| 4,090,255 | 5/1978 | Berger et al. | 365/154 |
| 4,168,539 | 9/1979 | Anderson | 365/190 |
| 4,259,730 | 3/1981 | Heuber et al. | 365/156 |

*Primary Examiner*—Stuart N. Hecker
*Attorney, Agent, or Firm*—Wesley DeBruin

[57] ABSTRACT

After a controlled strong lowering of the word line potential for the purpose of addressing a cell, said potential is immediately recharged simultaneously increasing the potential on the N side of the two PNP injectors of the cell and causing the injector capacitances of the selected storage cells and the bit line capacitances to form a capacitive voltage divider, so that the bit lines connected thereto are recharged to different degrees by the different magnitudes of the injector capacitances. Thus, the differential signal formed on the bit lines is noticeably amplified by the supply of currents of different magnitudes.

4 Claims, 9 Drawing Figures

CIRCUIT ARRANGEMENT FOR CAPACITIVE READ SIGNAL AMPLIFICATION IN AN INTEGRATED SEMICONDUCTOR STORE WITH STORAGE CELLS IN MTL TECHNOLOGY

FIELD OF THE INVENTION

The invention relates to a circuit arrangement for capacitive read signal amplification in an integrated semiconductor store with storage cells in MTL technology which are arranged at the crossings of word lines and bit line pairs and which are addressed via decoder circuits and controlled via read/write circuits and clock circuits.

CROSS REFERENCE TO RELATED APPLICATIONS

U.S. patent application Ser. No. 101,366 entitled "Method and Circuit Arrangement For Controlling An Integrated Semiconductor Memory" filed Dec. 7, 1979 by K. Heuber and S. K. Wiedmann, of common assignee herewith and granted as U.S. Pat. No. 4,280,198 on July 21, 1981.

U.S. patent application Ser. No. 136,859 entitled "Method of and Circuit Arrangement For Reading And/Or Writing An Integrated Semiconductor Storage with Storage Cells in MTL Technology", filed Apr. 3, 1980 by H. H. Heimer et al., of common assignee herewith and granted as U.S. Pat. No. 4,330,853 on May 18, 1952.

U.S. patent application Ser. No. 133,383 entitled "Integrated Semiconductor Memory and Method of Operating Same", filed Mar. 24, 1980 by H. H. Heimer et al of common assignee herewith, and granted as U.S. Pat. No. 4,313,179 on Jan. 26, 1982.

U.S. patent application Ser. No. 924,126 entitled "Semiconductor Integrated Injection Logic Structure Controlled by the Injector" filed July 13, 1978 by R. M. Hornung et al., of common assignee herewith, and granted as U.S. Pat. No. 4,277,701 on July 7, 1981.

U.S. patent application Ser. No. 186,829 entitled "Circuit Including At Least Two MTL Semi-Conducting Devices Showing Different Rise Times and Logic Circuits Made-Up Therefrom" by Gerard M. Lebesnerais filed Sept. 2, 1980, of common assignee herewith, and granted as U.S. Pat. No. 4,348,595 on Sept. 7, 1982.

BACKGROUND OF THE INVENTION AND PRIOR ART

In recent years, the field of logical circuits and integrated semiconductor stores in bipolar technology has been marked by brisk progress which in technical literature has become known as MTL (Merged Transistor Logic) or I²L (Integrated Injector Logic). Attention is drawn to the articles in the IEEE Journal of Solid-State Circuits, Vol. SC-7, No. 5, October 1972, pp. 340 ff and 346 ff. In addition, such storage cells are known from U.S. Pat. Nos. 3,736,477 and 3,816,758. Further, this technology (MTL or I²L) and its various applications has been described in a number of U.S. Patents and Publications, a number of which are identified below:

U.S. Pat. No. 3,643,231 entitled "Monolithic Associative Memory Cell" granted Feb. 15, 1972 to F. H. Lohrey and S. K. Wiedmann, and of common assignee herewith.

U.S. Pat. No. 3,736,477 entitled "Monolithic Semiconductor Circuit Concept of High Packing Density" granted May 29, 1973 to H. H. Berger and S. K. Wiedmann and of common assignee herewith.

U.S. Pat. No. 3,815,106 entitled "Flip-Flop Memory Cell Arrangement" granted June 4, 1974 to S. K. Wiedmann, and of common assignee herewith.

U.S. Pat. No. 3,816,758 entitled "Digital Logic Circuit" granted June 11, 1974 to H. H. Berger and S. K. Wiedmann, and of common assignee herewith.

U.S. Pat. No. 3,886,531 entitled "Schottky Loaded Emitter Coupled Memory Cell For Random Access Memory" granted May 27, 1975 to J. L. McNeill.

U.S. Pat. No. 3,993,918 entitled "Integrated Circuits" granted Nov. 23, 1976 to A. W. Sinclair.

U.S. Pat. No. 4,021,786 entitled "Memory Cell Circuit and Semiconductor Structure Therefore" granted May 3, 1977 to H. W. Peterson.

U.S. Pat. No. 4,090,255 entitled "Circuit Arrangement For Operating A Semiconductor Memory System" granted May 16, 1978 to H. H. Berger et al., and of common assignee herewith.

IBM Technical Disclosure Bulletin publication entitled "I²L/MTL Storage Cell Layout:" by H. H. Berger et al., Vol. 22, No. 10, March 1980, pages 4604-5.

IBM Technical Disclosure Bulletin publication (GE 8-77-0015) entitled "MTL Storage Cell" by S. K. Wiedmann, Vol. 21, No. 1, June 1978, pages 231-2.

"Merged-Transistor Logic (MTL)—A Low-Cost Bipolar Logic Concept" by Horst H. Berger and Siegfried K. Wiedmann, IEEE Journal of Solid-State Circuits, Vol. SC-7, No. 5, October 1972, pages 340-6.

"Integrated Injection Logic: A New Approach to LSI" by Kees Hart and Arie Slob, IEEE Journal of Solid-State Circuits, Vol. SC-7, No. 5, October 1972, pages 346-51.

"I²L Takes Bipolar Integration A Significant Step Forward" by R. L. Horton et al., Electronics Feb. 6, 1975, pages 83-90.

"I²L Puts It All Together For 10-bit a-d converter Chip" by Paul Brokaw, Electronics/Apr. 13, 1978, pages 99-105.

"Integrated Injection Logic Shaping Up As Strong Bipolar Challenge to MOS", Electronic Design 6, Mar. 15, 1974, pages 28 and 30.

Storage concepts with bipolar transistors have short switching times and are particularly suitable for the design of extremely highly integrated stores and logic circuit arrays (PLA's).

Stores comprising MTL-structured bipolar transistors necessitate a recharging of bit data and/or control line capacitances for selecting a storage cell. During that process, the voltage swing of the bit lines approximately equals the voltage swing of the selected word lines. As previously described in German Patent No. 2 511 518 (U.S. Pat. No. 4,090,255), the capacitive discharge currents are discharged to ground via the storage cells of the selected word line and via word line drivers. In highly integrated store matrices with a greater number of storage cells this has the disadvantage that the area requirements of the driver circuits, the electric power dissipation for each driver and the delay time during word line selection become excessive. Thus the advantages inherent in the MTL structure are partly offset.

To eliminate this disadvantage, German Offenlegungsschrift No. 28 55 866 (U.S. Pat. No. 4,280,198), proposes a method of driving a semiconductor storage and a circuit arrangement which do not have these shortcomings. The method is characterized in that prior to selection and in response to a selection signal, control signals from a control circuit known per se are simultaneously applied to a discharge circuit, common to all storage cells, and to switching transistors which are thus switched on, and in that the discharge currents of the line capacitances on the bit data and control lines flow through the switching transistors, being jointly discharged via the discharge circuit.

Although it is possible with this discharge method to use the minimum swing on the word line to prevent capacitive peak currents on the voltage supply lines and to obtain a relatively high degree of integration, these solutions have the following disadvantages.

The selection operation and the discharge operation of the bit lines must be effected sequentially. The increase in the sense current from the sense circuit after bit line selection decisively determines the access time to the storage cell. The bit and word line potential transistors operating in parallel must be switched on at the end of the selection time, thus increasing the cycle time of the store chip.

In addition, the peripheral circuits of a store thus designed still require a great number of components. The read signal emitted depends upon the direct current supplied by the read/write amplifier. To obtain a higher and steeper read and write signal, to reduce the number of control lines as well as the number of components required for the read/write circuits. German Patent Application No. P 29 26 050.2 (U.S. Pat. No. 4,330,853) proposes a method for reading and writing which is characterized in that the current required for reading and/or writing the storage cells is generated by discharging the injector capacitances of the nonaddressed storage cells and is directly applied to the addressed storage cells for reading and/or writing. The bit line discharge currents occurring are used to read and/or write a selected storage cell of the respective bit line pair. The discharge currents of the bit line and injector junction capacitances of the non-selected storage cells charge the injector diffusion capacitances of the selected cell. During this process, these diffusion capacitances are discharged via internal cell currents, discharge on the OFF side of the storage cell being effected much more rapidly than on the ON side, so that the read signal is the difference signal derived from the charges on the OFF and the ON side being discharged at different speeds. A relatively high read signal is obtained by operating the MTL storage cells by means of very low injector currents during reading. In this current range the current gain of cell pnp transistors has not yet noticeably decreased, so that a considerable proportion of the current flowing into the ON side of the cell is reinjected, thus generating the read signal. Although the proportion of the reinjected current compared to the total current injected into the ON side is relatively high, the absolute reinjection current is low. This leads to a read signal with a rather shallow edge.

As a result, the access time for a store thus operated is relatively long and the operating reliability depends relatively strongly on the tolerances of the circuit components.

Therefore, it is the object of the invention to provide a circuit arrangement for capacitive read signal amplification of an integrated semiconductor store with storage cells consisting of flip-flops with bipolar transistors in MTL technology, which by influencing the two recharge currents acting on the selected bit lines, considerably improves the leading edge of the read signal, reduces the tolerance dependence of circuit components and improves the access time by about 20 percent.

SUMMARY OF THE INVENTION

The invention may be summarized as follows:

By increasing for a short time the difference of the two recharge currents acting on the selected bit lines, the proposed circuit principle considerably improves the leading edge of the read signal. Computer analyses have shown that as a result the access time of highly integrated MTL semiconductor stores is reduced by more than 20 percent. In addition, the tolerance dependence is considerably reduced and the number of circuit components required is kept low.

The foregoing and other objects, features and advantages of the invention will be apparent from the following more particular description of the preferred embodiment of the invention, as illustrated in the accompanying drawings.

BRIEF DESCRIPTION OF THE DRAWINGS

The invention will be described in detail below by way of examples illustrated in the accompanying drawings in which.

DESCRIPTION OF THE PREFERRED EMBODIMENT

Figure 1:
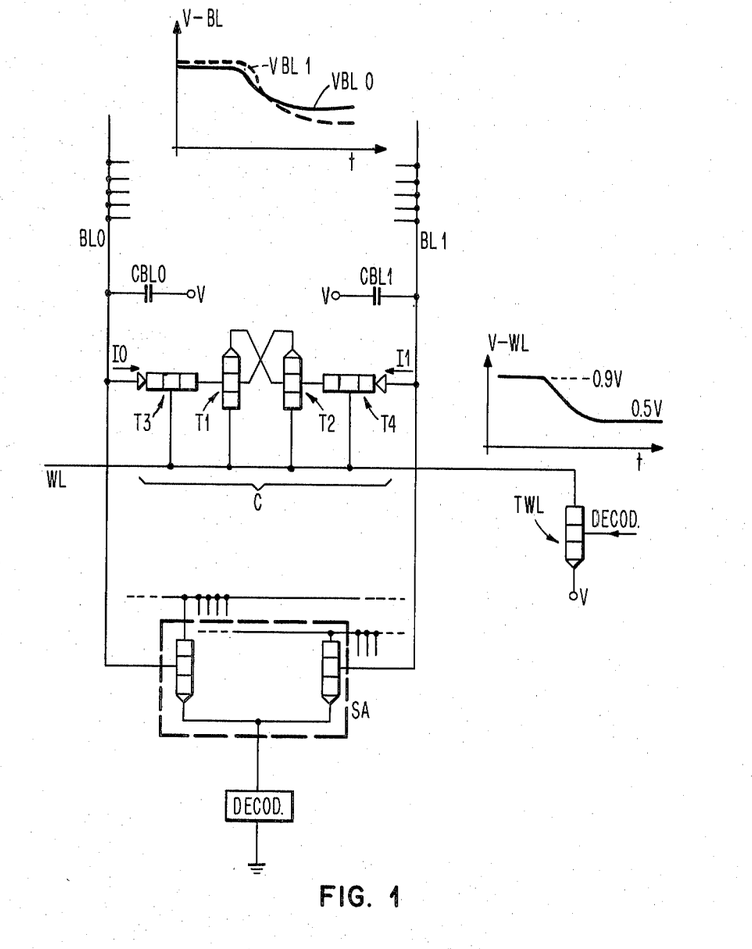
FIG. 1 shows a typical arrangement of an MTL storage cell on one storage level.

FIG. 1 shows the typical arrangement of a storage cell C within a storage plane with the word line WL, the bit lines BL0 and BL1, respectively, the read amplifier SA, and the appertaining decoder. The storage cell proper consists of the two crosscoupled bipolar transistors T1 and T2 as well as the two coupling transistors T3 and T4, the bases of which are connected to the word line WL and the emitters of which are connected to one bit line BL0 or BL1. The collectors of the two coupling transistors T3 and T4 are connected to the base of the cross-coupled transistors T1 and T2, respectively. The collectors of the two cross-coupled transistors T1 and T2 are also connected to the word line WL. The word line WL, in turn, is connected to a word line transistor TWL for switching on or off, the base of which is controlled by the preceding decoder, not shown.

The two bit line capacitances CBL0 and CBL1 for the bit lines BL0 and BL1, respectively, are also shown. The upper part of FIG. 1 also shows, in a small diagram, the voltage curve V-BL between bit lines BL0 and BL1 and, above the word line transistor TWL, the voltage curve V-WL on the word line WL.

To permit the formation of a read signal on a selected bit line pair BL0 and BL1, the illustrated bit line capacitances CBL0 and CBL1 must be recharged. About 80 percent of these bit line capacitances CBL0 and CBL1 consist of the injector capacitances of the non-selected cells and about 20 percent of the metal capacitances. For a 2K×9 RAM with 128 storage cells on one bit line the bit line capacitance is, for example, about 12 pF.

To obtain a high and steep read signal for a store comprising the storage cells shown in FIG. 1, the difference between the recharge currents of the bit line capacitances CBL0 and CBL1 must be as large as possible. This difference is determined by the reinjection current of the saturated cell PNP transistor. The PNP transistors generally available today have favorable reinjection current values only at low read currents, whereas at high read currents the current gain of such transistors drops considerably, so that the leading edge of the read signal is correspondingly shallow. However, as previously mentioned, a steeper leading edge of the read signal is highly desirable, since this reduces the access time, the access time tolerances and the circuit component tolerances.

By increasing for a short time the difference between the two recharge currents I0 and I1 acting on the selected bit lines BL0 and BL1, the leading edge of the read signal is considerably increased, as will be described in detail below. Computer analyses have shown that as a result the access time to an MTL store can be reduced by more than 20 percent.

Figure 2:
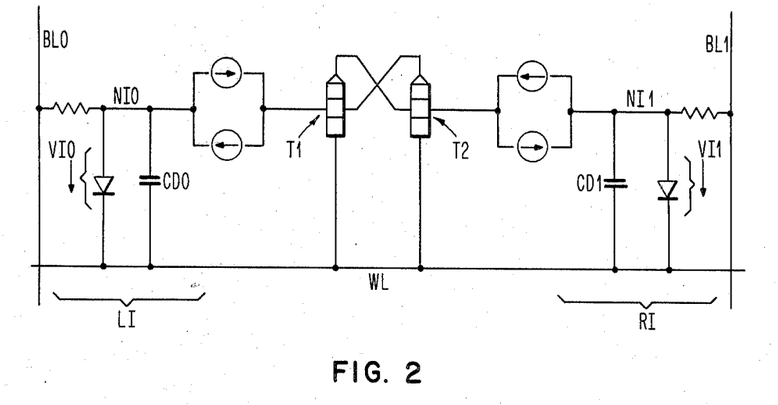
FIG. 2 shows a partial equivalent circuit diagram of an MTL storage cell (in accordance with FIG. 1)
Figure 3:
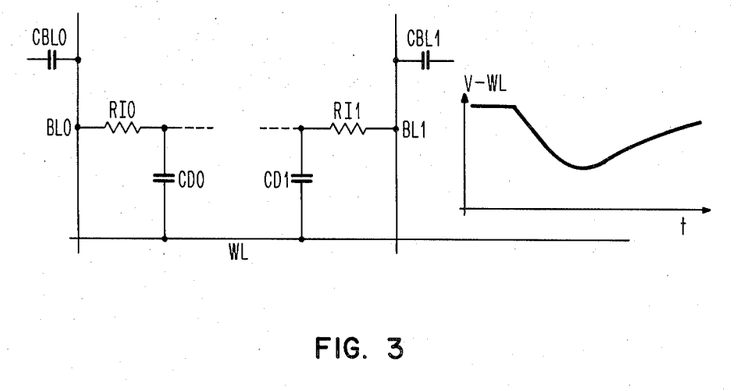
FIG. 3 shows an equivalent circuit diagram illustrating that the bit line capacitance and the cell diffusion capacitance form a capacitive voltage divider.

The typical operation and the measures in accordance with the invention will be described in detail below by way of the equivalent circuit diagrams of FIGS. 2 and 3.

For selection, the voltage V-WL (FIG. 3) on the word line WL is pulled down by about 400 mmV, so that during reading a capacitive read current from the bit line capacitances CBL0 and CBL1 flows across the two injectors into the selected storage cell. During this process, the read current charges the diffusion capacitances CD0 and CD1 by the same value. In accordance with the information stored in the cell flip-flop, one of the two PNP transistors is operated in saturation, while the other operates in the active range (see FIG. 2). Reinjection of the saturated transistor leads to a charge decay in the diffusion capacitance CD0 or CD1 on the saturated side, which proceeds more slowly than on the active side. The difference signal occurring in this way across the injectors is relatively small and has a shallow leading edge.

As the difference signal on the storage cell equals the difference between the voltages VI0 and VI1 across the two injector diodes, the diffusion capacitances CD0, CD1 of the right and the left injector are of different magnitudes.

$$CD = QS \times \frac{q}{kT} \times e^{\frac{q \times VJ}{kT}}$$

At a voltage difference of as low as VI0−VI1=4 mV, there is a 17 percent difference in the magnitude of the diffusion capacitances CD0 and CD1.

$$\frac{CD0}{CD1} = e^{\frac{q}{kT} \times (VJ0 - VJ1)}$$

$$= e^{\left(\frac{4}{26}\right)} = 1.17$$

As voltages of different magnitudes are applied across the PNP barrier layers of the injectors, the charge stored in the diffusion capacitances CD0 and CD1 also varies.

$$Q = QS \times e^{\frac{q \times VJ}{kT}}$$

The charge in the capacitance of the injector increases as the potential increases.

It will be described below how the difference in the charge stored in the two injector capacitances is used to increase the peak value and to improve the edge steepness of the read signal.

For this purpose, the potential of the selected word line, after having been lowered by a particular value (about 400 mV in the example described) in accordance with the methods previously used for addressing, is rapidly recharged by a particular value. This recharging or charging up of the selected word line WL leads to an increase in the potential on the N side of both PN injectors. Subsequently, the injector capacitances CD0 and CD1 of the selected cells and the bit line capacitances CBL0 and CBL1 form a capacitive voltage divider, as illustrated in FIG. 3. Because of the difference in magnitude of the two injector capacitances CD0 and CD1 the two bit lines BL0 and BL1 are recharged to different degrees, thus obtaining an improved read signal. This is explained below by means of a simplified numerical example which proceeds from the assumption that the total bit line capacitance is CBL0=CBL1=CBL=10 pF.

For the diffusion capacitance CD0, which increases beyond a maximum value of 30 pF when the potential of the selected word line WL is pulled down, a mean constant value of 10 pF is assumed.

Prior to charging up the word line WL, the read voltage in the present example is assumed to be VS=VBL1−VBL0=4 mV.

This corresponds to a mean diffusion capacitance of $$CD1 = CD0 \cdot e^{\frac{qVS}{kT}} = 11.7 \text{ pF}$$

at a word line swing of $\Delta VWL = 400$ mV, so that $$\Delta V_{BL0} = \frac{\Delta Q0}{CBL} = \frac{1}{CBL} \cdot \frac{\Delta VWL}{\frac{1}{CD0} + \frac{1}{CBL}} =$$

$$\frac{0.4 \text{ V}}{\frac{10}{10} + 1} = 0.2 \text{ V}$$

$$\Delta V_{BL1} = \frac{\Delta Q1}{CBL} = \frac{1}{CBL} \cdot \frac{\Delta VWL}{\frac{1}{CD1} + \frac{1}{CBL}} =$$

-continued $$\frac{0.4 \text{ V}}{\frac{10}{11.7} + 1} = 0.216 \text{ V}$$

i.e., the read signal increases by $$\Delta VS = \Delta VBL1 - \Delta VBL0 = 216 - 200 = 16 \text{ mV}$$

during charging up, so that the total read signal is considerably improved to a value of $$VS + \Delta VS = 4 + 16 = 20 \text{ mV}.$$

Figure 4A:
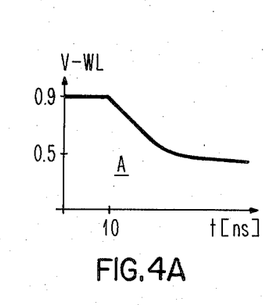
FIG. 4D shows the time curves A, B and C (cases A, B and C, respectively) of the difference between two injector currents, I0 and I1, of a selected cell for the appertaining word line voltage waveforms of FIG. 4A (case A), FIG. 4B (case B) and FIG. 4C (case C), respectively.
Figure 4B:
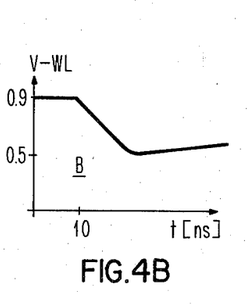
Figure 4C:
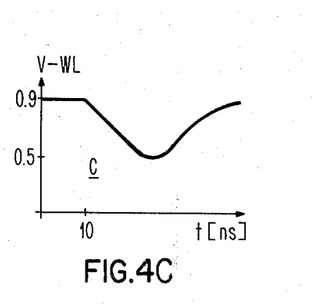
Figure 4D:
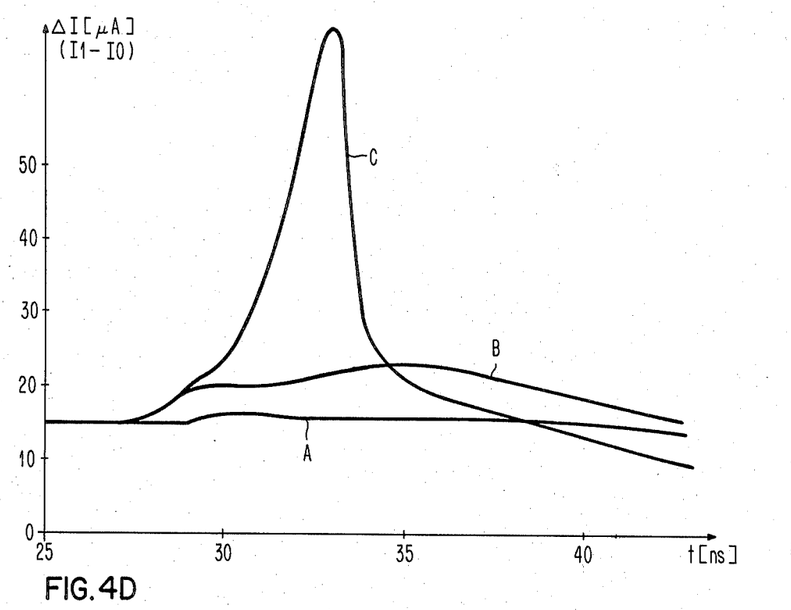

The diagram of FIG. 4D shows the time curves A, B and C (cases A, B and C respectively) of the difference between the two injector currents I0 and I1 of a selected cell for the word line voltage waveforms of FIG. 4A (case A), FIG. 4B, (case B) and FIG. 4C (case C) respectively.

The diagram of FIG. 4 shows quite clearly that the bit line capacitances CBL0 and CBL1 are recharged the more rapidly the greater the difference between the two currents I1 and I0. A great difference leads to a very fast and powerful read signal.

It is pointed out that, as a result of the voltage drop across the injector resistances RI0 and RI1 (FIG. 3), the read signal is applied to the diffusion capacitances CD0 and CD1 earlier than to the bit lines BL0 and BL1, respectively. This means, the diffusion capacitances CD0 and CD1 differ already noticeably at the time the read signal on the bit lines BL0 and BL1 is almost zero. Consequently, the differential charge required is stored in the diffusion capacitances CD0 and CD1 of the two cell injectors prior to the formation of a valid read signal on the bit lines BL0 and BL1. The curves A, B and C of FIG. 4D respectively show the difference current at the inputs of a selected storage cell, whereas FIGS. 4A, 4B and 4C, diagrams A to C, respectively show the appertaining voltage V-WL at a selected word line WL for three examples (cases A, B and C, respectively). The curves are the result of experimental measurements and tests carried out on a real RAM.

Initially, case A, curve A of FIG. 4D, will be referred to. This representation shows the curve of ΔI of the injector currents I1 and I0 if the word line WL (FIG. 4A) is kept at a constant selection potential V-WL after addressing. The selected word line WL is pulled down to that potential by about 400 mV in a time ranging from about 10 to 20 ns in this case.

The initial conditions for curve B of FIG. 4D, case B, are the same as for curve A, but at the time t=25 ns the word line transistor TWL is switched off via a read control circuit, the delay of which tracks with the remaining circuits. Thus, the selected word line (FIG. 4B) can be slowly charged by the current of the semiselected storage cells on the same word line WL. Curve C of FIG. 4D, case C, shows a noticeable increase of ΔI and thus a corresponding amplification of the read signal. In case C, FIG. 4C, deviating from case B, FIG. 4B not only the word line transistor TWL is switched off, but the selected word line WL is also rapidly charged (FIG. 4C) at the same time, by a transistor (transistor TWP in FIG. 5) being connected to the word driver stage. The considerably steeper edge of the read signal noticeably reduces the influence of the tolerances of the subsequent amplifier stage, so that the storage access time obtained is substantially reduced.

The capacitive read signal amplification does not affect the storage cell stability. As the selected storage cell is strongly overloaded when the word line WL is switched on, the internal difference signal of the storage cell flip-flop in case C, FIG. 4C, is more than 100 mV higher at the end of the selection phase than in the standby state. As has been shown, this method of capacitive read signal amplification permits reducing the access time by about 20 percent, with the number of circuit components required being extremely low, as will be described below.

Figure 5:
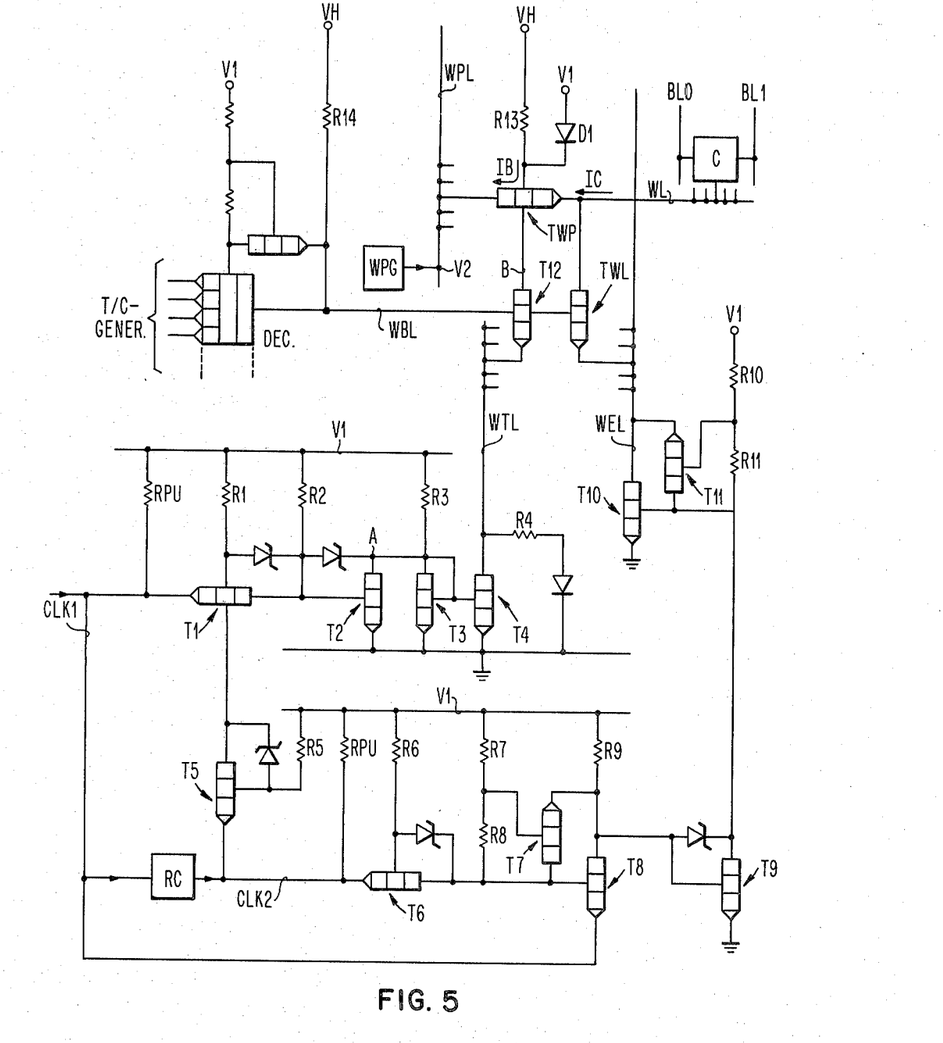
FIG. 5 shows a detailed circuit diagram for the capacitive read signal amplification.

FIG. 5 shows a detailed circuit diagram for capacitive read signal amplification. The operation of this circuit will be described by means of the pulse diagram of FIG. 6, initially assuming that the storage is in the standby state.

During this standby phase of the storage, the internal clock signals CLK1 and CLK2 are kept at a level of 1.4 V by pull-up resistors RPU. As a result, transistors T1, T5, T6 and T8 are OFF, while the subsequent transistors T2 and T9 in the circuit of FIG. 5 are ON. As long as CLK1 keeps the emitters of transistor T8 at a potential above about 0.8 V (V1≈1.4 V), transistor T8 remains OFF, and the base current flows from resistor R9 to the base of transistor T9. The voltage at the collector of transistor T9 controls a clamping circuit consisting of the transistors T10 and T11 as well as the resistors R10 and R11, by means of which the word emitter line WEL is pulled down to its lower switching level (see FIG. 6). As long as transistor T9 is ON, transistor T10 remains OFF. The word emitter line WEL is kept by one of the word line transistors TWL at the potential of the word line WL (word-base line WBL is selected). Subsequently, a current from resistor R14 flows across the base collector junction of transistor TWL and through the saturated transistor TWP to word potential line WPL.

Figure 6:
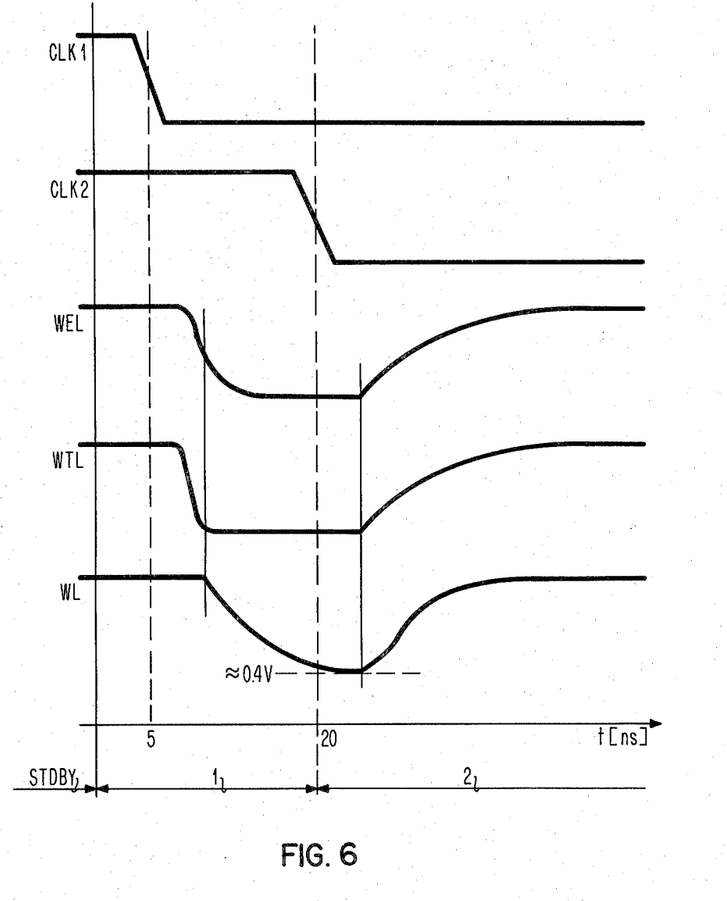
FIG. 6 shows a diagram of the typical voltage curve at different lines of the circuit in accordance with FIG. 5.

As previously mentioned, transistor T1 in FIG. 5 is OFF in the standby state, so that the current mirror consisting of transistors T3 and T4 is kept inactive by transistor T2. When the very low current through resistor R4, which is to keep the word division line WTL at a low potential in the standby state, is neglected, then transistor T12 can be considered practically OFF, and the whole current through resistor R13 is available as a base current for word potential transistor TWP. This transistor is deeply saturated, rigidly coupling the appertaining word line WL to the word potential line WPL. The voltage on the word potential line WPL is set by the word potential generator WPG to a value of about 1 V. The diagram of FIG. 6 shows on the left the potential curve during the standby phase STDBY, followed by the potential curve previously obtained in read signal amplification circuits (section 1), and in section 2 the voltage curve occurring when the word line potential is actively switched up.

Initially, the selection of word line WL will be described. After the outputs of the T/C generators have been switched to a fixed state in accordance with the address signals, the selection of a word line WL is initiated by switching down the internal clock signal CLK1. As soon as the potential of the line drops below 0.7 V at the time of clock signal CLK1, transistors T1 and T8 connected to said line are switched on. Transistors T5 and T6, however, continue to be switched off, as the voltage of clock signal CLK2 is still at 1.4 V. Transistor T9 is switched off via transistor T8, so that the voltage at the base of transistor T10 rises. As a result, transistor T10 is switched on, pulling the word emitter line WEL to the lower switching level of about 0.35 V set by the resistive divider consisting of resistors R10 and R11.

At the same time, the current mirror consisting of transistors T3 and T4 is activated by switching off transistor T2. As the collector of transistor T4 is connected to the emitter of transistor T12 via word division line WTL, the base current of the word potential transistor TWP is discharged via transistor T12. The base potential of the word potential transistor TWP drops to a voltage of about 0.6 V, which is determined by the clamping diode D1. As a result, word potential transistor TWP is switched off, and the word line WL can be pulled down to its selection potential of about 0.4 V by the word line transistor TWL. The rapid pulling down of the word line WL leads to the internal capacitances of the selected storage cells to be heavily charged, so that a read signal is formed with a particular delay at bit lines BL0 and BL1.

The amplification of the read signal obtained by actively switching up the selected word line WL will be described below. This corresponds to section 2 of the diagram of FIG. 6.

As long as the potential of the clock signal CLK2 is above the threshold of 0.7 V, the voltage curve on the word and bit lines WL and/or BL0 and BL1 corresponds to that obtained in the circuits used so far (section 1, FIG. 6). Only by the controlled delayed switching down of clock signal CLK2 on the corresponding line is the switching operation for increasing the edge steepness and the peak value of the read signal initiated.

While the voltage clock signal CLK1 drops below 0.7 V at the beginning of the read operation, a delay circuit, not shown, in the read control circuit RC is triggered. After about 15 ns, the output of said delay circuit pulls the line carrying the clock signal CLK2 to its lower switching level of 0.2 V. As a result, the two transistors T5 and T6 connected to said line are switched on subsequently blocking transistors T1 and T8 connected to the line for clock signal CLK1.

This leads to an increase in the collector potential of transistor T8 until the time transistor T9 is switched on. The collector current of T9 reduces the voltage at the base of transistor T10, blocking the latter, so that the cell current of the selected and the semi-selected storage cells C, which up to that stage has been discharged to ground via the word line transistor TWL and transistor T10, starts to rapidly charge the potential on word line WL.

Practically at the same time transistor T10 is blocked, the current mirror consisting of transistors T3 and T4 is switched off by transistor T2. Transistor T12 is switched off, and the base potential of the word potential transistor TWP is pulled up by the current flowing through resistor R13. As soon as the voltage at the base of word potential transistor TWP has risen to about 0.7 V above the potential of the selected word lines WL, said transistor is switched on, and the word line WL is charged to the voltage of 1 V of the word potential line WPL in accordance with the voltage increase at the base of transistor TWP. As the word line potential increases, the injector capacitances CD0 and CD1 supply capacitive currents of different magnitudes to the bit lines BL0 and BL1, thus forming a relatively high read signal with a steep leading edge (see section 2, FIG. 6).

While the invention has been particularly shown and described with reference to a preferred embodiment thereof, it will be understood by those skilled in the art that the foregoing and other changes in form and detail may be made without departing from the spirit and scope of the invention.

We claim:

1. In a monolithic memory employing merged transistor logic (MTL) memory cells, said monolithic memory comprising:

at least one memory cell having a first stable state of conductivity and a second stable state of conductivity, said at least one memory cell including, first and second NPN transistors and first and second PNP transistors, said first and second NPN transistors each having an emitter, a collector and a base, said first and second PNP transistors each having an emitter, a collector and a base, first connection means connecting said emitter of said first NPN transistor to said base of said second NPN transistor and said emitter of said second NPN transistor to said base of said first NPN transistor, second connection means connecting said collector of said first PNP transistor to said base of said first NPN transistor and said collector of said second PNP transistor to said base of said second NPN transistor;

a pair of bit lines consisting of a first bit line and a second bit line, said first bit line being connected to said emitter of said first PNP transistor and said second bit line being connected to said emitter of said second PNP transistor;

a word line, said word line being connected in common to said base of said first PNP transistor, said collector of said first NPN transistor, said base of said second PNP transistor and said collector of said second NPN transistor;

a sense amplifier coupled between said first and second bit lines;

read circuit means connected to said word line for causing an electrical manifestation indicative of the state of said at least one memory cell to appear on said pair of bit lines, said read circuit means including time sequential circuit means for lowering and a predetermined time thereafter raising the potential on said word line whereby the said electrical manifestation indicative of the state of said at least one memory cell and appearing on said bit lines is enhanced in magnitude;

said time sequential circuit means including, a word potential transistor (TWP) having an emitter, base and collector, said emitter of said word potential transistor being connected to said word line (WL), a word potential generator (WPG) connected via a word potential line (WPL) to said collector of said word potential transistor (TWP), a source of potential (VH) coupled to said base of said word potential transistor (TWP), a third transistor having an emitter, base and collector, said collector of said third transistor being connected to said base of said word potential transistor (TWP), a word line transistor (TWL) having an emitter, base and collector, said collector of said word line transistor being connected to said word line (WL);

decoder circuit means for selecting said word line said decoder circuit means being connected in common to said base of said third transistor and said base of said word line transistor (TWL); and clock signal control circuit means responsive to a clock signal, said clock signal control circuit means having a first circuit portion connected to said emitter of said word line transistor (TWL) and a second circuit portion connected to said emitter of said third transistor whereby said first circuit portion lowers the potential of said word line (WL) and said predetermined time thereafter said second circuit portion raises the potential of said word line (WL).

2. In a monolithic memory employing merged transistor logic (MTL) memory cells, as recited in claim 1, wherein said clock signal control circuit means further includes a time delay circuit connected between said first and second circuit portions of said clock signal control circuit means, said delay circuit having a time delay essentially equal to said predetermined time between the lowering and raising of said word line potential.

3. In a monolithic memory employing merged transistor logic (MTL) memory cells, said monolithic memory comprising:

at least one memory cell having a first stable state of conductivity and a second stable state of conductivity, said at least one memory cell including interconnected first and second MTL circuits, said first MTL circuit including a first NPN transistor and a first PNP transistor, said second MTL circuit including a second NPN transistor and a second PNP transistor, each of said NPN and PNP transistors having an emitter, base and collector, connection means connecting said emitter of said first NPN transistor to said base of said second NPN transistor and said emitter of said second NPN transistor to said base of said first NPN transistor;

a pair of bit lines consisting of a first bit line and a second bit line, said first bit line being connected to said emitter of said first PNP transistor and said second bit line being connected to said emitter of said second PNP transistor;

a word line, said word line being connected in common to said base of said first PNP transistor, said collector of said first NPN transistor, said base of said second PNP transistor and said collector of said second NPN transistor;

a sense amplifier coupled between said first and second bit lines;

read circuit means connected to said word line for causing an electrical manifestation indicative of the state of said at least one memory cell to appear on said pair of bit lines, said read circuit means including time sequential circuit means for lowering and after a predetermined time raising the potential on said word line whereby the said electrical manifestation indicative of the state of said at least one memory cell and appearing on said bit lines is enhanced in an electrical parameter readily recognized by said sense amplifier; said time sequential circuit means including, a word potential transistor (TWP) having an emitter, base and collector, said emitter of said word potential transistor being connected to said word line (WL), a word potential generator (WPG) connected via a word potential line (WPL) to said collector of said word potential transistor (TWP), a source of potential (VH) coupled to said base of said word potential transistor (TWP), a third transistor having an emitter, base and collector, said collector of said third transistor being connected to said base of said word potential transistor (TWP), a word line transistor (TWL) having an emitter, base and collector, said collector of said word line transistor being connected to said word line (WL);

decoder circuit means for selecting said word line, said decoder circuit means being connected in common to said base of said third transistor and said base of said word line transistor (TWL); and clock signal control circuit means responsive to a clock signal, said clock signal control circuit means having a first circuit portion connected to said emitter of said word line transistor (TWL) and a second circuit portion connected to said emitter of said third transistor whereby said first circuit portion lowers the potential of said word line (WL) and said predetermined time thereafter said second circuit portion raises the potential of said word line (WL).

4. In a monolithic memory employing merged transistor logic (MTL) memory cells, as recited in claim 3, wherein said clock signal control circuit means includes a delay circuit having a time delay essentially equal to said predetermined time between the lowering and raising of said word line potential.

* * * * *